(12) United States Patent
Koole et al.

(10) Patent No.: US 8,828,253 B2
(45) Date of Patent: Sep. 9, 2014

(54) LITHOGRAPHY USING SELF-ASSEMBLED POLYMERS

(75) Inventors: Roelof Koole, Eindhoven (NL); Johan Frederik Dijksman, Weert (NL); Sander Frederik Wuister, Eindhoven (NL); Emiel Peeters, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/816,720

(22) PCT Filed: Jul. 21, 2011

(86) PCT No.: PCT/EP2011/062554
§ 371 (c)(1),
(2), (4) Date: Feb. 12, 2013

(87) PCT Pub. No.: WO2012/031818
PCT Pub. Date: Mar. 15, 2012

(65) Prior Publication Data
US 2013/0140272 A1    Jun. 6, 2013

Related U.S. Application Data

(60) Provisional application No. 61/381,317, filed on Sep. 9, 2010.

(51) Int. Cl.
*B44C 1/22* (2006.01)
*B81C 1/00* (2006.01)
*H01L 21/033* (2006.01)

(52) U.S. Cl.
CPC ........... *B44C 1/2227* (2013.01); *B81C 1/00031* (2013.01); *B81C 2201/0149* (2013.01); *H01L 21/0337* (2013.01); *B81C 2201/0198* (2013.01)
USPC ................. 216/49; 216/38; 216/41; 438/694; 438/700

(58) Field of Classification Search
CPC ............... B44C 1/227; B81C 1/00031; B81C 2201/149; B81C 2201/0198; H01L 21/0337; H01L 21/3086; G03F 7/0002
See application file for complete search history.

(56) References Cited

U.S. PATENT DOCUMENTS 6,749,969 B2    6/2004    Horak et al.
7,186,656 B2    3/2007    Sreenivasan (Continued)

OTHER PUBLICATIONS

International Search Report mailed Apr. 24, 2012 in corresponding International Patent Application No. PCT/EP2011/062554.

(Continued)

*Primary Examiner* — Lan Vinh
*Assistant Examiner* — Jiong-Ping Lu
(74) *Attorney, Agent, or Firm* — Pillsbury Winthrop Shaw Pittman LLP

(57) ABSTRACT

A method of lithography on a substrate uses a self-assembled polymer (SAP) layer deposited on the substrate, with first and second domains arranged in a pattern across the layer. A planarization layer is formed over the SAP and a development etch applied to substantially remove a portion of the planarization layer over the second domain leaving a cap of the planarization layer substantially covering the first domain. The uncapped second domain is then removed from the surface by a breakthrough etch leaving the capped first domain as a pattern feature on the surface. A transfer etch may then be used to transfer the pattern feature to the substrate using the capped first domain. The capping allows the second domain to be removed, e.g., without excessive loss of lateral feature width for the remaining first domain, even when the difference in etch resistance between the first and second domains is small.

20 Claims, 4 Drawing Sheets

(56) References Cited

U.S. PATENT DOCUMENTS

| | | | |
|---|---|---|---|
| 7,323,417 | B2 | 1/2008 | Sreenivasan |
| 2006/0261379 | A1 | 11/2006 | Tsukamoto et al. |
| 2008/0190888 | A1* | 8/2008 | Heejoon et al. ............... 216/43 |
| 2008/0293183 | A1* | 11/2008 | Tsukamoto et al. .......... 438/102 |
| 2009/0117360 | A1 | 5/2009 | Clevenger et al. |
| 2010/0165512 | A1 | 7/2010 | Albrecht et al. |

OTHER PUBLICATIONS

Cheolmin Park et al., "Enabling nanotechnology with self assembled block copolymer patterns," Polymer, vol. 44, pp. 6725-6760 (2003).

Michael W. Lin et al., "Planarization for Reverse-Tone Step and Flash Imprint Lithography," Proc. of SPIE, vol. 6151, pp. 61512G-1-61512G-12 (2006).

Miri Park et al., "Block Copolymer Lithography: Periodic Arrays of ~ $10^{11}$ Holes in 1 Square Centimeter," Science, Vol, 276, pp. 1401-1404 (May 30, 1997).

E. Bhoje Gowd et al., "Highly ordered palladium nanodots and nanowires from switchable block copolymer thin films," Nanotechnology, vol. 20, No. 415302, pp. 1-10 (2009).

* cited by examiner

LITHOGRAPHY USING SELF-ASSEMBLED POLYMERS

CROSS-REFERENCE TO RELATED APPLICATIONS

This application is the U.S. national phase entry of International Patent Application No. PCT/EP2011/062554, filed Jul. 21, 2011, which claims the benefit of U.S. provisional application 61/381,317, which was filed on Sep. 9, 2010 and which is incorporated herein in its entirety by reference.

FIELD

The present invention relates to a method for manufacture of devices by lithography. In particular, the invention relates to a method using a resist layer of self-assembled polymers.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, either of an imprint templates or of another substrate and a chemical resist or imprintable medium may be used to achieve this.

The use of self-assembly of block copolymers (BCPs) has been considered as a potential method for improving the resolution to better values than those obtainable by prior lithography methods or as an alternative to electron beam lithography for preparation of imprint templates.

Self-assemblable block copolymers are compounds useful in nanofabrication because they may undergo an order-disorder transition on cooling below a certain temperature (order-disorder transition temperature To/d) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interface between domains may have a width of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to silicon nitride substrates.

SUMMARY

Block copolymers comprise different blocks, each comprising an identical monomer, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a copolymer having covalently linked blocks of polystyrene (PS) monomer (lyophobic block) and polymethylmethacrylate (PMMA) monomer (lyophilic block). Other block copolymers with blocks of differing lyophobicity/lyophilicity may be useful. For instance, tri-block copolymers (A-B-C) may be useful, as may alternating or periodic block copolymers (e.g. $[-A-B-A-B-A-B-]_n$ or $[-A-B-C-A-B-C]_m$ where n and m are integers). The blocks are connected to each other by covalent links in a linear or branched fashion (e.g. star or branched configuration).

Block copolymers may form many different phases upon self-assembly, dependent upon the volume fractions of the blocks, degree of polymerization within each block type (e.g. number of monomers of each respective type within each respective block), the optional use of a solvent and surface interactions. When applied in a thin film, the geometric confinement may pose additional boundary conditions that may limit the numbers of phases. In general only spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as self-assemblable polymers include, but are not limited to, poly(styrene-b-methylmethacrylate), poly(styrene-b-2-vinylpyrididne), poly(styrene-b-butadiene), poly(styrene-b-ferrocenyldimethylsilane), poly(styrene-b-ethylenoxide), poly(ethyleeneoxide-b-isoprene). The symbol "b" signifies "block" Although these are di-block copolymers as examples, self-assembly may also or instead employ tri-block, tetrablock or other multi-block copolymers.

The self-assembled block copolymer phases may orient with symmetry axes parallel or perpendicular to the substrate and lamellar and cylindrical phases are most interesting for lithography applications, as they may form line and space patterns and hole arrays, respectively, and may provide good contrast when one of the domain types is subsequently etched.

Two methods used to guide self-assembly of block copolymers onto surfaces are graphoepitaxy and chemical pre-patterning. In the graphoepitaxy method, self-organization of block copolymers is guided by topological pre-patterning of the substrate. Self-aligned block copolymers can form, for example, parallel linear patterns with adjacent lines of the different polymer block domains in the trenches defined by the patterned substrate. For instance if the block copolymer is a di-block copolymer with A and B blocks within the polymer chain, where A is lyophilic (e.g., hydrophilic) and B is lyophobic (e.g., hydrophobic) in nature, the A blocks may assemble into a domain formed adjacent to a side-wall of a trench if the side-wall is also lyophilic in nature. Resolution may be improved over the resolution of the patterned substrate by the block copolymer pattern subdividing the spacing of a pre-pattern on the substrate.

In the chemical pre-patterning method, the self-assembly of block copolymer domains is guided by a chemical pattern on the substrate. Chemical affinity between the chemical pattern and at least one of the types of copolymer blocks within the polymer chain may result in the precise placement of one of the domain types onto a corresponding region of the chemical pattern on the substrate. For instance if the block copolymer is a di-block copolymer with A and B blocks, where A is lyophilic and B is lyophobic in nature, and the chemical pattern comprises a lyophobic region on a lyophilic surface, the B domain may preferentially assemble onto the lyophobic region. As with the graphoepitaxy method of alignment, the resolution may be improved over the resolution of the patterned substrate by the block copolymer pattern subdividing the spacing of one or more pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases.

In a typical process to implement the use of block copolymer self-assembly in nanofabrication, a substrate may be modified with an orientation control layer, or primer layer, to induce the preferred orientation of the self-assembly pattern in relation to the substrate. For some block copolymers used in a self-assemblable polymer layer, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by rendering the substrate surface neutral to both blocks, in other words having a similar chemical affinity for each block, such that both blocks wet the surface in a similar manner. A neutral surface may be created by use of random copolymer brushes which are covalently linked to the substrate by reaction of a hydroxyl terminal group, or some other reactive end group, to oxide at the substrate surface. Alternatively or additionally, a crosslinkable random copolymer or an appropriate silane can be used to render a surface neutral by acting as an intermediate layer between the substrate surface and the layer of self-assemblable polymer. An intermediate layer between the substrate and the layer of self-assemblable polymer, onto which the self-assemblable polymer layer is directly deposited, is referred to hereinafter as a primer layer. The primer layer may be provided with one or more gaps to permit one of the block types of the self-assemblable polymer layer to come into direct contact with the substrate below the primer layer. This may be useful for anchoring or aligning a domain of a particular block type of the self-assemblable polymer layer to the substrate.

The substrate may be further provided with a topological or chemical pre-pattern as set out above to guide the self-assembly pattern. A thin layer of self-assemblable block copolymer may be deposited on the substrate, e.g., onto an intermediate neutral or primer layer as set out above. A suitable method for deposition is spin coating as it is capable of providing a well defined, uniform, thin layer. A suitable layer thickness for a deposited block copolymer film is approximately 10 to 100 nm. Following deposition of the block copolymer film, the film may still be disordered or only partially ordered and additional steps may be needed to promote and/or complete self-assembly.

The block copolymers are self-assembled into a highly ordered regular pattern. The self-assembly process typically occurs most readily at a temperature above the glass-transition temperature and below the order-disorder temperature for the block copolymer. This stage is referred to as ordering, and is generally achieved by uniform heating. The self-assembly process may nucleate at multiple points in the block copolymer film and this may result in the formation of defects.

Defects formed during ordering as set out above may be partly removed by annealing. Defects such as disclinations (which are line defects in which rotational symmetry is violated, e.g. where there is a defect in the orientation of a director) may be annihilated by pairing with other defects or disclinations of opposite sign. Chain mobility of the block copolymer may be a significant factor for determining defect migration and annihilation and so annealing may be carried out at a temperature where chain mobility is high but the self-assembled ordered pattern is not lost. This implies a temperature up to a few ° C. above or below the order/disorder temperature To/d for the polymer.

Unfortunately, some isolated defects are hard to annihilate. They have a high immobility which may be attributable to high energy input required to restructure the ordered surroundings of such defects.

Ordering and defect annihilation may be combined into a single annealing process or a plurality of processes may be used in order to provide a layer of self-assembled block copolymer, having an ordered pattern of domains of differing chemical type (of different block types), for use as a resist layer for lithography.

Self-assembly of block copolymers is a process where the assembly of many small components (the block copolymers) results in the formation of larger more complex structures (the nanometer sized features in the self-assembled pattern, referred to as domains in this specification). Defects arise naturally from the physics controlling the self-assembly of the polymers. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration.

For block copolymers which undergo self-assembly, the block copolymer will exhibit an order-disorder temperature $T_{o/d}$. $T_{o/d}$ may be measured by any suitable technique for assessing the ordered/disordered state of the polymer, such as differential scanning calorimetry (DSC). If layer formation takes place below this temperature, the molecules will be driven to self-assemble. Above the temperature $T_{o/d}$, a disordered layer will be formed with the entropy contribution from disordered A/B domains outweighing the enthalpy contribution arising from favorable interactions between neighboring A-A and B-B block pairs in the layer.

The block copolymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

In the following discussion, and generally throughout the specification, the self-assemblable polymer is treated as having two domain types (based on polymer blocks A and B respectively) forming the ordered pattern. The same description applies for self-assemblable polymers with three or more different domain types forming the ordered pattern, modified to take into account the additional domain types.

In order to transfer a pattern from the self-assembled polymer layer, a first domain type will typically be removed by so-called breakthrough etching to provide a pattern of a second domain type on the surface of the substrate with the substrate laid bare between the pattern features of the second domain type. It is to be noted that the term substrate as used in this specification may include a substrate, such as a semiconductor substrate, having one or more assist layers on the surface to which lithography is to be applied, and these one or more layers are treated as part of the substrate.

Following the breakthrough etching, the pattern may be transferred by so-called transfer etching using an etching means (e.g., an etchant) which is resisted by the second domain type and so forms recesses in the substrate surface where the surface has been laid bare.

Typically, for self-assemblable block copolymers, the difference in etch resistance between the different domain types is small. This may be referred to as low etch resistance contrast. For instance, for PS (polystyrene) and PMMA (polymethylmethacrylate) blocks, the etch resistance contrast is 1:1.5 and 1:2.9 for an oxygen plasma etch and for an argon plasma etch respectively (i.e. for every 1 nanometer of PS removed, 1.5 nanometers of PMMA is removed).

As an alternative to plasma etching, selective photolytic removal of a domain type is possible. For instance a PMMA domain may be removed by photolytic etching to leave the substrate laid bare between islands or pattern features of polystyrene.

Because of the thickness of a typical self-assembled polymer layer (typically about 1.5 times the pitch of the ordered pattern), and because of the relatively poor etch contrast which is inherent to self-assembled block copolymers, the breakthrough etch, in addition to substantially completely removing one domain type, may lead to reduction in a lateral dimension of the one or more remaining pattern features of the second domain type. It is also the case that a domain may exhibit anisotropic behavior when subject to breakthrough etching. This is undesirable as it may lead to imprecise control of critical dimension (CD) for the patterned substrate formed after a transfer etch.

The thermodynamics of polymer self-assembly is predominantly governed by the immiscibility (i.e. lack of mutual chemical affinity) of the chemical species making up the different blocks as described in Flory-Huggins theory. Whether or not a polymer will exhibit self-assembly into nanoscale patterns is characterized by the product $\chi N$, in which $\chi$ is the Flory-Huggins interaction parameter and N is the total degree of polymerization.

Mean field theory calculations indicate that an order-disorder transition should occur for $\chi N=10.5$ for symmetrical block copolymers, which implies that the minimum total degree of polymerization needed to give phase segregation for a class of block copolymers is dependent upon the Flory-Huggins parameter for this block copolymer at the annealing temperature following the relationship $N=10.5/\chi$. It should be understood that the value of 10.5 is not to be taken as a threshold, but rather it indicates an approximate theoretical region above or below which ordering or disordering may take place. When $\chi N$ is less than about 10.5 the block copolymer will not generally exhibit self-assembly behavior and the resulting polymer film will be in a disordered, high entropy state. For $\chi N$ greater than about 10.5, the block copolymer may show strong segregation of the block domains and the copolymer may self-assemble into regular patterns with sharp interfaces between adjacent domains of differing block types.

For block copolymers with $\chi N$ greater than 10.5, self-assembled pattern formation occurs when a thin film sample is brought to a temperature sufficiently above the glass transition temperature of the copolymer to provide reasonable polymer mobility, but below To/d for the copolymer, to allow nano-phase separation and pattern formation.

The degree of polymerization N is directly related to the minimum characteristic domain length scale, $L_0$, attainable for a specific block copolymer. Typically $L_0=N^\delta$, where $\delta$ can vary from 0.5 to 1.0 depending on whether the polymer exhibits strong or weak segregation. $L_0$ gives an indication of the smallest feature sizes derivable for the self-assembled polymer.

The line edge roughness, LER, and line width roughness, LWR, of self-assembled features for a self-assemblable block copolymer are governed by polydispersity of the block copolymers and by the interfacial width between polymer blocks at the domain boundaries between adjacent domains of differing block type. The interfacial width is given by the relationship $\Delta_\infty=2a/\sqrt{6\chi}$.

The LWR is typically related to LER for self-assembled polymers by the relationship LWR=$\sqrt{2}$ LER.

Hence, the LWR and LER are inversely proportional to the Flory-Huggins parameter $\chi$, and so it is desirable that $\chi$ is as large as possible when the self-assembled polymer is fixed in its structure (for instance when the self-assembled polymer is solidified by reducing its temperature to a temperature below the glass transition temperature Tg for the polymer) so that LWR/LER are as small as possible.

Limited pattern persistence length and high defect densities may limit the usefulness of a self-assemblable polymer, such as block copolymers, for use in the semiconductor industry. Both the pattern persistence length of an ordered polymer layer and its defect density may be influenced by the value of the Flory-Huggins parameter at the temperature at which the ordered polymer layer is formed or annealed (i.e. at a temperature at or around To/d for the polymer). Persistence length is a measure of the ability to maintain coherence of periodicity over long distances.

A high value for the Flory Huggins parameter $\chi$ at the annealing temperature strongly inhibits inter-diffusion of polymer blocks of differing types, and so hinders the processes leading to defect annihilation and pairing, but a high value of $\chi$ is desirable to give low line edge and line width roughness (LER/LWR) for the assembled, ordered pattern. In practice, the requirement to reach thermodynamic equilibrium by providing high polymer chain mobility and interdiffusion of polymer blocks means that the chemical incompatibility of the blocks should not be too great. If the blocks are relatively chemically compatible, but sufficiently incompatible for self-assembly to occur at low To/d, self-assembled, highly ordered patterns will form but this is likely to be at the expense of relatively poor etch resistance contrast between the different domain types. For chemically similar species, the difference in etch resistance for each species to the same etch is likely to be small.

The Flory-Huggins parameter for PS-b-PMMA (polystyrene-b-polymethylmethacrylate) block copolymer allows for the generation of features down to 22 nm, but for smaller features other block copolymers are used, such as polypentafluorostyrene(PPFS)-b-PMMA, PS-PVP(polyvinylpyrrolidone), PS-PFI (fluorinated polyisoprene), or PEO (poly ethyleneoxide)-IP(polyisoprene).

As there may be low etch resistance contrast between two domain types based on differing polymer blocks, the etch contrast may not be sufficient to allow for a proper transfer of the features into the underlying substrate. It is noted that the height of the domains for the self-assembled layer is typically 1.5 times the pitch, so for example a 50 nm height for 16 nm half-pitch node (32 nm pitch).

The selection of self-assemblable polymers to achieve optimal self-assembly results (such as low defectivity, low LWR/LER, etc.) for a certain node is challenging in its own right. To further include a selection requirement for sufficient etch resistance contrast between the domain types formed from the different blocks, so that accurate transfer of the pattern to the substrate is achievable, is an additional constraint that would significantly limit freedom in material choice for the blocks. Hence there is a need to enhance etch resistance contrast for the domain types by another means.

Accordingly, it is desirable, for example, to provide a method for using a self-assembled layer of block copolymer as a resist layer suitable for use in device lithography which addresses or overcomes, for example, one or more of the problems in the art. It is desirable, for example, to provide a method which improves the accuracy of transfer, by etching, from a self-assembled pattern to an underlying substrate. It is desirable, for example, to improve the accuracy of transfer from a self-assembled polymer layer having at least two domain types with low etch resistance contrast between the two domain types.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 1% by weight of non-specified components.

Whenever appropriate, the use of the term "comprises" or "comprising" may also be taken to include the meaning "consists essentially of" or "consisting essentially of".

According to an aspect, there is provided a method of lithography on a surface of a substrate having a self-assembled polymer layer thereon comprising first and second domains arranged in a pattern across the layer, the method comprising:

forming a planarization layer over the layer of self-assembled polymer, the planarization layer having a first portion over the first domain and a second portion over the second domain;

applying a development etch to the planarization layer to substantially remove the second portion leaving at least part of the first portion as a cap substantially covering the first domain to form capped first domain;

substantially removing the second domain from the surface, leaving the capped first domain as a pattern feature on the surface; and transferring the pattern feature to the substrate using the capped first domain as an etch resist.

According to an aspect, there is provided a method for transferring a pattern feature from a self-assembled polymer layer comprising first and second domains arranged in a pattern across the layer on a substrate, to the substrate, the method comprising:

applying a first etch to the self-assembled polymer layer such that the first domain is etched to a first thickness less than a second thickness of the second domain;

forming a planarization layer over the layer of self-assembled polymer, the planarization layer having a first portion over the first domain and a second portion over the second domain;

applying a development etch to the planarization layer to substantially remove the second portion leaving at least part of the first portion as a cap substantially covering the first domain to form capped first domain;

substantially removing the second domain from the surface, leaving the capped first domain as a pattern feature on the surface; and transferring the pattern feature to the substrate using the capped first domain as an etch resist.

According to an aspect, there is provided a method of forming a pattern feature on a substrate from a self-assembled polymer layer thereon, the self-assembled polymer layer comprising first and second domains arranged in a pattern across the layer, the method comprising:

forming a planarization layer over the layer of self-assembled polymer, the planarization layer having a first portion over the first domain and a second portion over the second domain;

applying a development etch to the planarization layer to substantially remove the second portion leaving at least part of the first portion as a cap substantially covering the first domain to form capped first domain; and substantially removing the second domain from the surface, leaving the capped first domain as a pattern feature on the surface.

The following features are applicable to all the various aspects of the invention where appropriate. When suitable, combinations of the following features may be employed as part of the methods and compositions described herein, for instance as set out in the claims. The methods and compositions described herein are particularly suitable for use in device lithography. For instance the methods and compositions described herein may be used for treatment or formation of a resist layer of self-assembled polymer for use in patterning a device substrate directly or for use in patterning an imprint template for use in imprint lithography.

The self-assemblable polymer may be a block copolymer as set out hereinbefore comprising at least two different block types which are self-assemblable into an ordered polymer layer having the different block types associated into first and second domain types. The block copolymer may be a di-block copolymer or a tri-block or a multi-block copolymer. Alternating or periodic block copolymers may be used as the self-assemblable polymer. Although only two domain types may be mentioned in some of the following aspects and examples, an embodiment of the invention is also applicable to self-assemblable polymers with three or more different domain types.

In an embodiment, the self-assemblable polymer is a block copolymer comprising one or more first blocks of first monomer and one or more second blocks of second monomer.

By chemical affinity, in this specification, is meant the tendency of two differing chemical species to associate together. For instance chemical species which are hydrophilic in nature have a high chemical affinity for water whereas hydrophobic compounds have a low chemical affinity for water but a high chemical affinity for alkanes. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as alkanes or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Suitably, the first domain has a first thickness less than a second thickness of the second domain. This could arise naturally from the self assembly process for instance, or may desirably be as a result of application of a treatment to the self-assembled polymer layer. For instance, the treatment may be a first etch, or may be a photolytic process (e.g. UV irradiation of PMMA blocks may lead to their erosion). Another suitable process may be surface reconstruction using a solvent, such as set out in Gowd et. al. Nanotechnology 20 (2009) 415302.

The method may comprise applying a first etch to the self-assembled polymer layer such that the first domain is etched to a first thickness less than a second thickness of the second domain prior to forming the planarization layer.

The first etch may be, for instance, a chemical etch (e.g. by application of an etch solution) or may be a plasma etch. In an embodiment, the first etch may be a directional (anisotropic) etch such as a directional plasma (i.e. reactive ion) etch, or a photolytic etch. When the first etch is a plasma or reactive ion etch, it may be, for instance, an oxygen plasma etch or an argon plasma etch. A reactive ion etch uses a plasma combined with an electric field to accelerate ions from the plasma into the substrate. This is a directional (i.e. anisotropic) etch.

The first etch may be applied as a uniform etch to the layer of self-assemblable polymer, with the difference in thickness between the first and second domains arising from the differing resistances to etching of the first and second domains. This etch resistance contrast will typically arise from the differing chemical affinities of the chemical species making up the first and second domains respectively, with the first domain being removed more rapidly than the second domain by the first etch such that the first domain will have a smaller thickness than the second domain after the first etch if both first and second domains are initially of the same thickness in the self-assembled polymer layer.

As already explained herein, the etch resistance contrast for first and second domains may be relatively low, meaning that the etching rates for the two domain types are not greatly different from each other, so that the application of the first etch to the self-assemblable polymer may only give rise to a small difference in thickness between first and second domains. However, even a small difference in thickness may be sufficient for a cap of planarization layer to be left remaining over the first domain, after formation of the planarization layer and application of a development etch to remove the planarization layer over the second domain.

As with the first etch, the development etch may be uniformly applied to the planarization layer. For the reasons set out above, the planarization layer will have a greater depth over the first domain than over the second domain because of the differences in thickness between the remaining first and second domains after the first etch. Even though the planarization layer may not have a completely planar or flat upper surface, and may partially follow the topography of the self-assembled polymer layer on which it is deposited, provided that the planarization layer is thicker over the first domain than it is over the second domain, then a uniformly applied development etch, applied for a suitable time, should be able to substantially remove the planarization layer over the second domain leaving a cap of the planarization layer in place over the first domain.

Typically a Si-containing material will be used as a planarization layer, in which case a fluorine based etch (e.g. $CF_4$ or $CHF_3$ plasma etch) may be used for the development etch.

The second domain may then be substantially removed from the surface, leaving the capped first domain as a pattern feature on the surface. This may suitably be achieved by application of a breakthrough etch to the substrate and layers thereon. The breakthrough etch is suitably an etch which is capable of removing the second domain substantially or completely to lay bare the surface of the substrate in the location previously occupied by the second domain, while leaving the first domain in place, covered by a protective cap of the planarization layer, which is substantially resistant to removal by the breakthrough etch. In a typical case the breakthrough etch may be an oxygen plasma etch, which etches the non-Si containing domain, but to which the Si-containing planarization layer is resistant. Alternatively, the removal of the second domain may employ the same etching method as the first etch, with the proviso that the material of the planarization layer, forming the cap, should be sufficiently resistant to the etching to remain in place following removal of the second domain. In other words, etching of the second domain using the same etching as the first etch should be much faster than the etching rate for the planarization material.

As a result, the desired pattern feature may be transferred to the substrate using the remaining capped first domain as an etch resist when a transfer etch is carried out.

A suitable transfer etch will depend upon the substrate. For a silicon substrate, a fluorine based etch (e.g. $CF_4$ or $CHF_3$ plasma etch) may be employed.

In an embodiment, the development etch is applied for as short a time necessary to provide an adequate difference in thicknesses between the first and second domains without leading to excessive removal of the domains. This is to minimize any lateral erosion of the domains during the first etch.

The difference in thickness may, for instance, be 5 nm or more. For example, the first thickness may be 5 nm or more. The second thickness is 5 nm, or more, greater than the first thickness.

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rates.

Planarization layers are known in the art of device lithography and are used to provide a substantially level or flat topography over an underlying, uneven topography. A suitable planarization layer is of a material which will flow into one or more recesses in the underlying topography while self-levelling on its upper surface. Typically the planarization layer will be a flowable liquid when initially applied and solidified after levelling. Typically, the planarization layer will be a continuous planarization layer over the self-assembled polymer layer.

The planarization layer may be applied, for instance, by spin-coating a liquid planarization composition onto the self-assembled polymer layer and solidifying the liquid planarization composition to provide the planarization layer. Other suitable methods for application or formation of a planarization layer include dip-coating, blade-coating or chemical or vapor deposition.

Solidification may be achieved, for example, by cooling a liquid planarization composition which is a melt below its solidification temperature, or by evaporation of solvent from a liquid planarization composition which is a solution.

The planarization layer may suitably be of a planarization material selected from the group consisting of silicon-containing acrylate polymer, hydrogen silsesquioxane and polydimethylsiloxane. The presence of silicon in the planarization layer may be effective in making the planarization layer resistant to certain etch compositions or etching methods.

BRIEF DESCRIPTION OF THE DRAWINGS

Specific embodiments of the invention will be described with reference to the accompanying figures, in which.

DETAILED DESCRIPTION

Figure 1A:
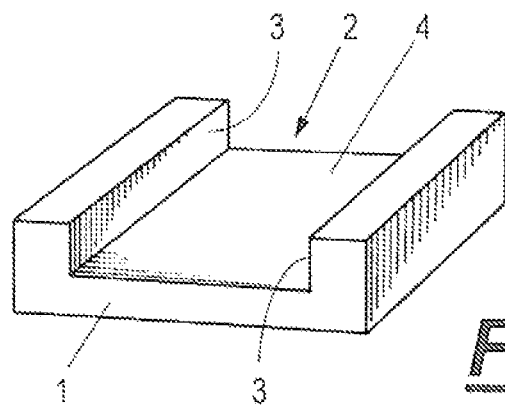
FIGS. 1A to 1C schematically depict directed self-assembly of A-B block copolymers onto a substrate by graphoepitaxy and formation of relief patterns by selective etching of one domain.
Figure 1B:
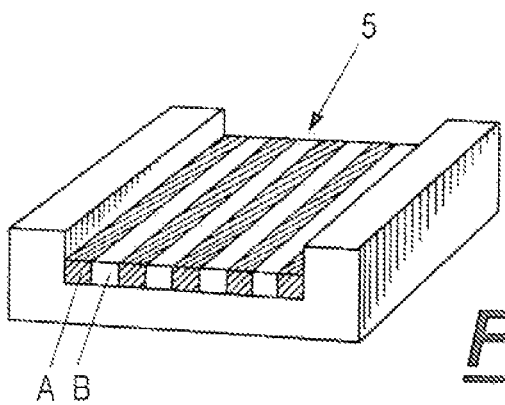
Figure 1C:
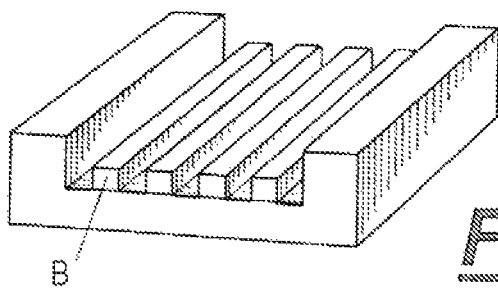

FIG. 1A shows a substrate 1 with a trench 2 formed therein bounded by one or more side walls 3 and a bottom surface 4. In FIG. 1B, a self-assemblable A-B block copolymer with lyophilic A blocks and lyophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the side wall 3, which is also lyophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may also be achieved, for instance, by selective photodegradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench within the sidewall with a type A domain against each side wall.

Figure 2A:
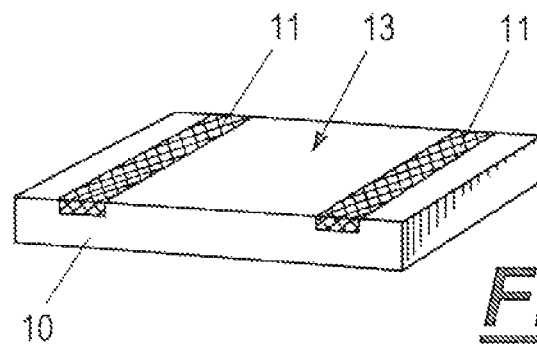
FIGS. 2A to 2C schematically depict directed self-assembly of A-B block copolymers onto a substrate by chemical pre-patterning and formation of a relief pattern by selective etching of one domain.
Figure 2B:
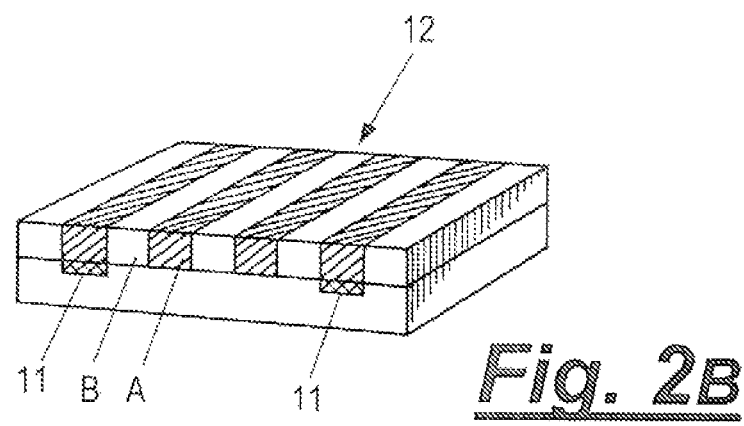
Figure 2C:
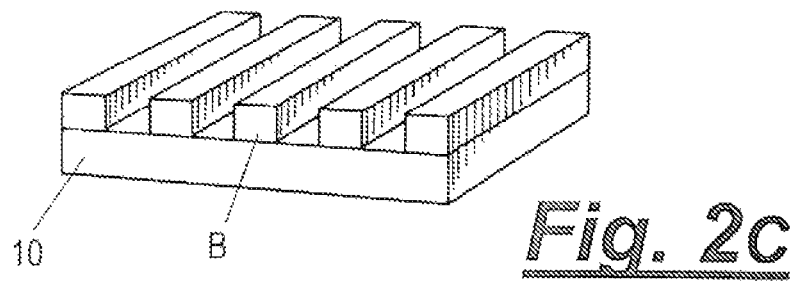

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with lyophilic A blocks and lyophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A lyophilic domains have nucleated atop the pinning stripes 11, which are also lyophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

Figure 3A:
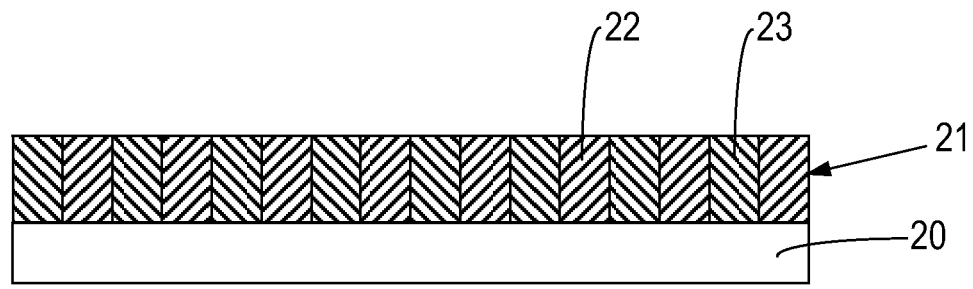
FIGS. 3A and 3B schematically depict a method for transferring a pattern feature from a self-assembled polymer layer to a substrate.
Figure 3B:
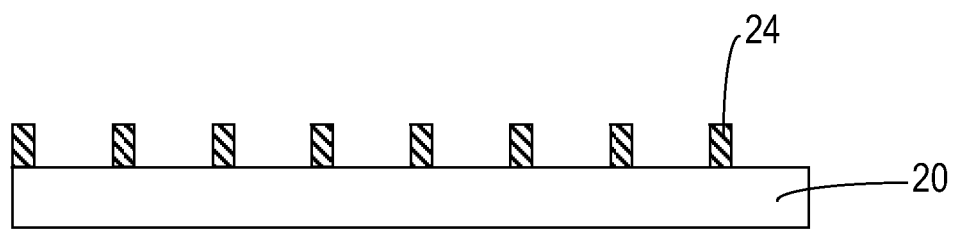

FIGS. 3A and 3B schematically depict a method for transferring a pattern feature from a self-assembled polymer layer 21 to a substrate 20. In FIG. 3A, the substrate 20 has a self-assembled polymer layer 21 on its surface, the self-assembled polymer layer 21 having first 22 and second 23 domains forming an alternating pattern across the layer 21. For the example shown, the self-assemblable polymer is a block copolymer polystyrene(PS)-block-polymethylmethacrylate(PMMA), with PMMA as first domain 22 and PS as second domain 23. The etch resistance contrast is about 1:1.5 (PS:PMMA) for an oxygen plasma etch.

FIG. 3B shows the structure after application of an oxygen plasma etch to substantially remove the first domain 22 of PMMA. The poor etch resistance contrast means that a substantial reduction in the lateral extent of the remaining islands 24 of second domain has also been caused by the oxygen plasma etch. Hence the remaining pattern features formed by the islands 24, when subsequently transferred into the substrate by a transfer etch, using the islands 24 as resist, will not provide an accurate transfer of the features of the original self-assembled polymer layer.

Figure 4A:
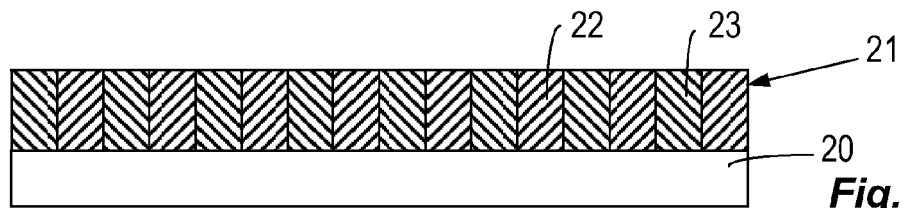
FIGS. 4A to 4E schematically depict an embodiment of a method for transferring a pattern feature from a self-assembled polymer layer to a substrate.

FIGS. 4A to 4E schematically depict a method according to an embodiment of the invention for forming pattern features from a self-assembled polymer layer 21 on a substrate 20 ready for subsequent transfer into the surface of the substrate 20 by transfer etching. In FIG. 4A, the substrate 20 has a self-assembled polymer layer 21 on its surface, the layer 21 having first 22 and second 23 domains forming an alternating pattern across the layer 21. As for the prior example depicted in FIG. 3A, the self-assemblable polymer is a block copolymer polystyrene(PS)-block-polymethylmethacrylate (PMMA), with PMMA as first domain 22 and PS as second domain 23.

Figure 4B:
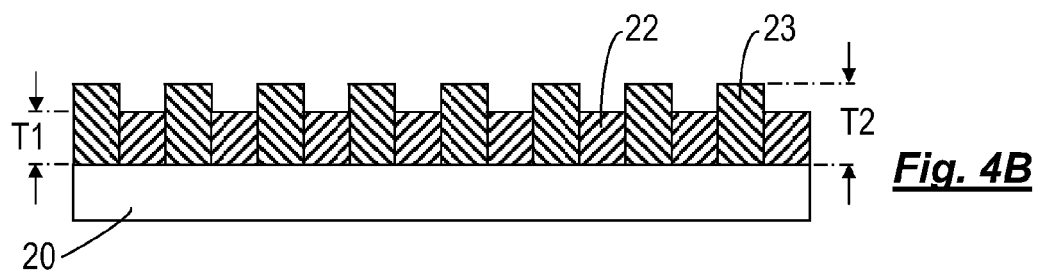

FIG. 4B shows the structure following a short application of an oxygen plasma etch to remove part of the first domain 22 of PMMA. The poor etch resistance contrast means some of the second domain 23 will also be removed during the etch, but the lateral extent of the second domain will not be significantly reduced because a short etch time is adequate to provide a difference in thickness between T1, the thickness of the first domain, and T2, the thickness of the second domain.

Figure 4C:
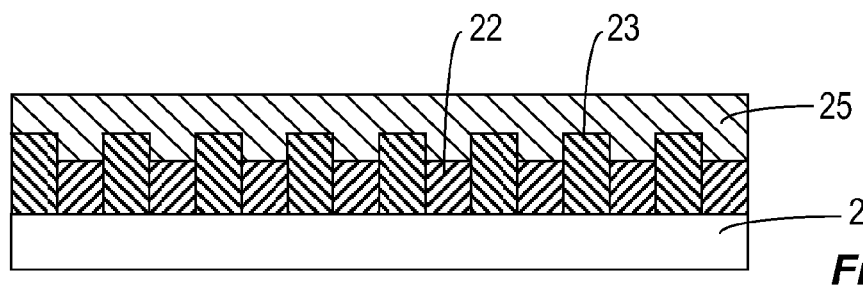

In FIG. 4C, following the first etch of the layer 21 to provide recesses of depth (T2−T1) in its upper surface over the first domain 22, a planarization layer 25 is deposited over the layer 21 as a liquid melt, filling the recesses over the first domain 22 and covering the tops of the second domain 23, and subsequently solidified by cooling. It will be understood that although FIG. 4C shows the planarization layer 25 as having a planar upper surface, in practice, this may exhibit undulations arising from incomplete leveling of the planarization layer 25 prior to its solidification. However, the thickness of the planarization layer 25 measured over the first domain 22 should be greater than its thickness measured over the second domain 23.

Figure 4D:
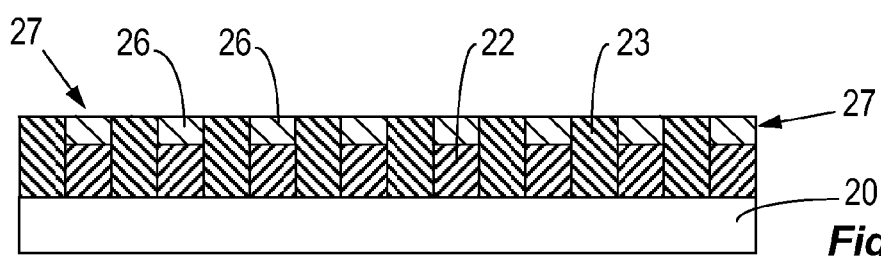

FIG. 4D shows the structure following uniform application of a development etch using a $CHF_3$ or $CF_4$ plasma etch whereby the planarization layer 25 has been partially removed so that the tops of the second domain 23 have again been laid bare, but leaving caps 26 of planarization layer 25 in the recesses and covering the tops of the first domain 22 to form capped first domain 27. End point detection using e.g. optical detection or mass-spectrometry in situ may be used to determine the correct moment to terminate the first etch step. For instance, a step change in Si content of the detected vapor from the plasma will indicate that the tops of domain 23 have been laid bare.

Figure 4E:
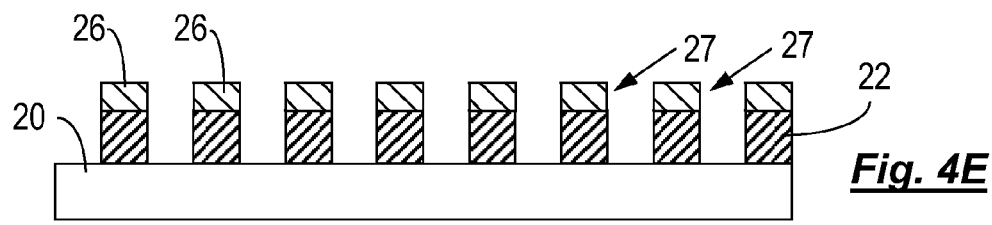

In FIG. 4E, the structure is shown after a breakthrough etch, once again an oxygen plasma etch, has been uniformly applied to the upper surface. The caps 26 are of a material highly resistant to the breakthrough etch and protect the first domain 22 from being eroded, whereas the uncovered second domain 23 is removed by the breakthrough etch to lay bare the substrate surface where it stood leaving pillars of capped first domain 27 with caps 26 still in place.

Hence the remaining pattern features formed by the pillars of the capped first domain 27, when subsequently transferred into the substrate by a transfer etch, using the capped pillars 22,26 as resist, will provide a more accurate transfer of the features of the original self-assembled polymer layer 21 than the method as schematically shown in FIGS. 3A and 3B. However, it is to be noted that the features are effectively reversed (i.e. a negative image) when the method of FIG. 4 is used as opposed to the method of FIG. 3.

The described and illustrated embodiment is to be considered as illustrative and not restrictive in character, it being understood that only a preferred embodiment have been shown and described and that all changes and modifications that come within the scope of the invention as defined in the claims are desired to be protected. For instance, there may be a substrate planarization layer and/or a bottom anti-reflection coating layer interposed between the self-assembled polymer layer and the substrate. For instance, the first etch may not be necessary if the self-assembled polymer layer is such that the thicknesses T1 and T2 differ for the first and second domains immediately upon assembly.

An embodiment of the invention permits etch resistance contrast to be achieved by use of a cap of planarization layer rather than by constraining selection of the chemical species used for the first and second domains of the self-assemblable polymer. Hence, the polymer chemistry may be optimized for characteristics other than etch resist contrast, using an embodiment of the invention to compensate for low etch resist contrast by reducing undesired lateral erosion of pattern features. Much greater etch resistance contrast may be obtainable than would conventionally be attainable using a self-assembled polymer layer, thus providing a substantial benefit when transferring a pattern from a self-assembled polymer layer to a substrate.

An embodiment of the present invention relates to lithography methods. The methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of bit-patterned media or discrete track media for magnetic storage devices (e.g. for hard drives).

In particular, an embodiment of the invention is of use for high resolution lithography, where features patterned onto a substrate have a feature width or critical dimension of about 1 µm or less, typically 100 nm or less or even 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. Lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers between the self-assembled polymer layer and the substrate.

The invention claimed is:

1. A method of lithography on a surface of a substrate having a self-assembled polymer layer thereon comprising first and second chemically-distinct domains arranged in a pattern across the layer, the method comprising:
    forming a planarization layer over the layer of self-assembled polymer, the planarization layer having a first portion over the first domain and a second portion over the second domain;
    applying a development etch to the planarization layer to substantially remove the second portion leaving at least part of the first portion as a cap substantially covering the first domain to form capped first domain;
    substantially removing the second domain from the surface, leaving the capped first domain as a pattern feature on the surface; and
    transferring the pattern feature to the substrate using the capped first domain as an etch resist.

2. The method of claim 1, wherein the first domain has a first thickness less than a second thickness of the second domain.

3. The method of claim 2, comprising applying a first etch to the self-assembled polymer layer such that the first domain is etched to a first thickness less than a second thickness of the second domain prior to forming the planarization layer.

4. The method of claim 3, wherein the first etch is a directional plasma or photolytic etch.

5. The method of claim 4, wherein when the first etch is a directional plasma etch and it is an oxygen plasma etch or an argon plasma etch.

6. The method of claim 3, wherein the second thickness is 5 nm, or more, greater than the first thickness.

7. The method of claim 3, wherein the first thickness is 5 nm or more.

8. The method of claim 1, wherein the planarization layer is applied by spin-coating a liquid planarization composition onto the self-assembled polymer layer and solidifying the liquid planarization composition to provide the planarization layer.

9. The method of claim 1, wherein the planarization layer comprises a planarization material selected from the group consisting of silicon-containing acrylate polymer, hydrogen silsesquioxane and polydimethylsiloxane.

10. The method of claim 1, wherein substantially removing the second domain from the surface is performed by a separate etch from an etch used in transferring the pattern feature to the substrate using the capped first domain as an etch resist.

11. The method of claim 1, wherein the development etch is a separate etch from an etch used to substantially remove the second domain from the surface.

12. A method for transferring a pattern feature from a self-assembled polymer layer comprising first and second chemically-distinct domains arranged in a pattern across the layer on a substrate, to the substrate, the method comprising:
    applying a first etch to the self-assembled polymer layer such that the first domain is etched to a first thickness less than a second thickness of the second domain;
    forming a planarization layer over the layer of self-assembled polymer, the planarization layer having a first portion over the first domain and a second portion over the second domain;
    applying a development etch to the planarization layer to substantially remove the second portion leaving at least part of the first portion as a cap substantially covering the first domain to form capped first domain;
    substantially removing the second domain from the surface, leaving the capped first domain as a pattern feature on the surface; and
    transferring the pattern feature to the substrate using the capped first domain as an etch resist.

13. The method of claim 12, wherein the second thickness is 5 nm, or more, greater than the first thickness.

14. The method of claim 12, wherein the planarization layer comprises a planarization material selected from the group consisting of silicon-containing acrylate polymer, hydrogen silsesquioxane and polydimethylsiloxane.

15. A method of forming a pattern feature on a substrate from a self-assembled polymer layer thereon, the self-assembled polymer layer comprising first and second chemically distinct domains arranged in a pattern across the layer, the method comprising:
    forming a planarization layer over the layer of self-assembled polymer, the planarization layer having a first portion over the first domain and a second portion over the second domain;
    applying a development etch to the planarization layer to substantially remove the second portion leaving at least part of the first portion as a cap substantially covering the first domain to form capped first domain; and
    substantially removing the second domain from the surface, leaving the capped first domain as a pattern feature on the surface.

16. The method of claim 15, wherein the first domain has a first thickness less than a second thickness of the second domain.

17. The method of claim 16, comprising applying a first etch to the self-assembled polymer layer such that the first domain is etched to a first thickness less than a second thickness of the second domain prior to forming the planarization layer.

18. The method of claim 17, wherein the second thickness is 5 nm, or more, greater than the first thickness.

19. The method of claim 17, wherein the first thickness is 5 nm or more.

20. The method of claim 15, wherein the planarization layer comprises a planarization material selected from the group consisting of silicon-containing acrylate polymer, hydrogen silsesquioxane and polydimethylsiloxane.

* * * * *